United States Patent [19]

Smith et al.

[11] Patent Number: 4,672,240
[45] Date of Patent: Jun. 9, 1987

[54] PROGRAMMABLE REDUNDANCY CIRCUIT

[75] Inventors: Teresa B. Smith; Philip C. Smith, both of Columbia, Md.

[73] Assignee: Westinghouse Electric Corp., Pittsburgh, Pa.

[21] Appl. No.: 770,486

[22] Filed: Aug. 29, 1985

Related U.S. Application Data

[62] Division of Ser. No. 464,259, Feb. 7, 1983, Pat. No. 4,556,975.

[51] Int. Cl.$^4$ ............... H03K 19/003; H03K 19/094; G11C 80/00
[52] U.S. Cl. .................... 307/449; 307/441; 307/450; 307/463; 307/468
[58] Field of Search ............... 307/449, 450, 441, 463, 307/465, 468, 219; 365/200, 230

[56] References Cited

U.S. PATENT DOCUMENTS 3,886,532  5/1975  Wegener et al. ............... 365/230
4,041,459  8/1977  Horninger ..................... 307/468

Primary Examiner—Stanley D. Miller
Assistant Examiner—M. R. Wambach
Attorney, Agent, or Firm—W. G. Sutcliff

[57] ABSTRACT

A memory redundancy circuit is described incorporating a sequential row or column counter associated with a plurality of programmable row or column decoders. The sequential row counter includes a sequence circuit for each programmable row decoder. The sequence circuit and programmable row decoder incorporate fixed and variable threshold transistors such as metal nitride oxide semiconductor (MNOS) transistors. The threshold of the variable threshold transistors are switched in response to address signals and control signals to permit redundancy. A disable circuit is also described to permit removal of the redundancy circuits to permit retest of the other circuits.

11 Claims, 8 Drawing Figures

PROGRAMMABLE REDUNDANCY CIRCUIT

GOVERNMENT CONTRACT

The Government has rights in this invention pursuant to Contract No. F33615-80-C-1199 awarded by the Department of the Air Force.

This is a division of application Ser. No. 06/464,259, filed Feb. 7, 1983, now U.S. Pat. No. 4,556,975.

BACKGROUND OF THE INVENTION

1. Field of the Invention

This invention relates to a circuit for providing redundancy in response to electrical control signals and more particularly to a circuit for substituting spare rows or columns of memory elements in a memory array in place of faulty rows or columns.

2. Description of the Prior Art

Semiconductor memories are being manufactured in the U.S. wherein a memory array of elements is accessed by a row decoder and column decoder to address a particular memory element or row of memory elements in the memory array. A sense amplifier built in a semiconductor chip senses the memory state of the selected memory element when addressed by the row decoder and column decoder. The density of the memory array on a semiconductor chip has increased from 16,000 memory elements to 64,000 memory elements and higher in recent years. As the memory size has increased, the difficulty of building perfect semiconductor memory chips has increased significantly. To improve the situation, redundant memory bits in the form of additional rows or columns in the memory array have been included on the semiconductor chip. The semiconductor memory is first tested while it is in a semiconductor wafer joined with other semiconductor memory chips. At this stage in the manufacture of semiconductor memory chips, extra circuits can be substituted when a faulty area in the primary memory array of memory elements is discovered. To date, many manufacturers in the United States and several Japanese manufacturers have reported circuits to implement the substitution of memory elements in a memory array necessary to accomplish repairs of faulty memory elements. The repaired semiconductor memory chips may thus pass all the electrical tests and be shipped or sold as semiconductor memory chips. Western Electric has recorded a factor of 30 percent improvement in yield in the early stages of semiconductor memory chip production thereby establishing the need and value of redundancy.

A publication by J. G. Posa, entitled "What To Do When The Bits Go Out", published in *Electronics*, July 28, 1981, pages 117–120, describes efforts by numerous companies to increase the yield of memory chips by incorporating some sort of redundancy at the wafer stage. At page 119 starting at the middle of the left-hand column, the substitution of spare bits, such as spare rows or columns, are discussed to replace faulty bits. Methods used by industry to substitute redundant memory bits include electrical fusing, wherein the fuses may be polysilicon or metal, laser cuts, or nonvolatile storage elements like floating gates. At the lower left-hand column of page 119 he suggests that the future use of nonvolatile elements to store bad addresses may be used in electrically erasable PROMs and perhaps even RAMs.

Specific redundancy circuits or memories using polysilicon fuses are described in a publication entitled "Designing Static RAMs For Yield As Well As Speed", by R. Sud and K. C. Hardee, appearing in *Electronics*, July 28, 1981, pages 121–126. FIG. 2b shows a latch including a fuse which may be blown to force the latch in a second state at all times. FIG. 3 shows spare decoders for addressing a spare column which may be switched in place of a faulty column of memory bits in a memory array. The replacement of a defective row in a memory array is also discussed.

Additional redundancy circuits utilizing polysilicon fuses are described in a publication entitled "Equipping A Line of Memories With Spare Cells", by R. Abbott, K. Kokkonen, R. I. Kung, and R. J. Smith, appearing in *Electronics*, July 28, 1981, pages 127–130. FIG. 1a shows a fuse in a circuit for either providing the true or complement address signal at its output. FIG. 2a shows circuitry for addressing a spare row and for disabling all other rows when the spare row is addressed. The electrical fuses are programmed following the step of testing the memory array and detecting the addresses of faulty bits. The fuses store the bad addresses of faulty bits and provides a signal to enable a spare row to be addressed at times the faulty bit is addressed while disabling the decoder to the row containing the faulty bit.

The use of polysilicon links opened up by a laser to achieve redundancy in memories is described in an article entitled "Using A Laser Beam To Substitute Good Cells For Bad", by R. T. Smith, appearing in *Electronics*, July 28, 1981, pages 131–134. FIG. 2a shows a decoder circuit having a laser programmable link for severing a bad row from its driver. FIG. 2b shows a spare decoder which may be programmed to respond to a specific address which would then be coupled to a spare row in the memory array. The laser programmable link measures approximately $3 \times 14$ micrometers and the laser spot size ranges from 7 to 8 micrometers. Prior to opening up links with a laser, a test program must be run locating the faulty bits. The laser is used to open up links in the memory circuits while the circuits are still on the wafer prior to dicing and packaging.

It is therefore desirable to provide a decoder which may be programmed electrically either at the wafer stage or after packaging.

It is further desirable to provide a programmable decoder that uses variable threshold transistors.

It is further desirable to provide a plurality of programmable decoders which may be programmed one at a time to allow the substitution of a spare row or spare column in place of a faulty row or faulty column of memory bits in a memory array.

It is further desirable to provide means for disabling the access of faulty rows or faulty columns when a spare row or spare column is substituted.

It is further desirable to provide a sequencer which includes variable threshold transistors to permit sequential programming of a plurality of decoders over extended periods of time, years, and with intervals of power supply voltage interruptions or loss.

It is further desirable to provide circuitry for disabling the redundant circuitry to permit inspection of the original memory array through the original row and column decoders of the memory array.

SUMMARY OF THE INVENTION

In accordance with the present invention, apparatus is described for electrically substituting one or more spare rows or columns in a memory array for faulty rows or columns and for reinspecting electrically the original memory array after said substitution to confirm the existence of faulty rows or columns. The substitution of rows or columns may include associated address or column decoders.

The invention further provides a programmable decoder having a plurality of address signals, true and complement, coupled thereto to the gate of a respective transistor. Each transistor coupled from an output terminal to a respective variable threshold transistor and fixed threshold transistor to ground potential. The gate of the variable threshold transistors is coupled in common to a memory write control voltage signal and the gate of the fixed threshold transistors is coupled in common to a polarization voltage at appropriate times.

The invention further provides a sequence circuit to permit programming of a plurality of decoders one at a time and for retaining the sequence during periods of power loss by providing a variable threshold transistor associated with each programmable decoder. The variable threshold transistor may be switched from the depletion mode to the enhancement mode at times when the respective decoder is being programmed. And first and second transistors responsive to the status of the variable threshold transistor are provided for coupling a control signal to its respective decoder and for coupling a control signal to the next available decoder, additional circuitry is provided with respect to each decoder to provide positive feedback of certain signals prior to programming of a decoder and for providing other voltages to disable the decoder following programming.

The invention further provides circuitry to enable substituted rows or columns to be disabled and to permit electrical testing of the original memory array at times after spare rows and columns have been substituted for faulty rows or columns. The circuitry includes a fixed threshold transistor coupled to the output of each programmable decoder to clamp at selected times the outputs to ground potential.

DESCRIPTION OF THE PREFERRED EMBODIMENT

Figure 1:
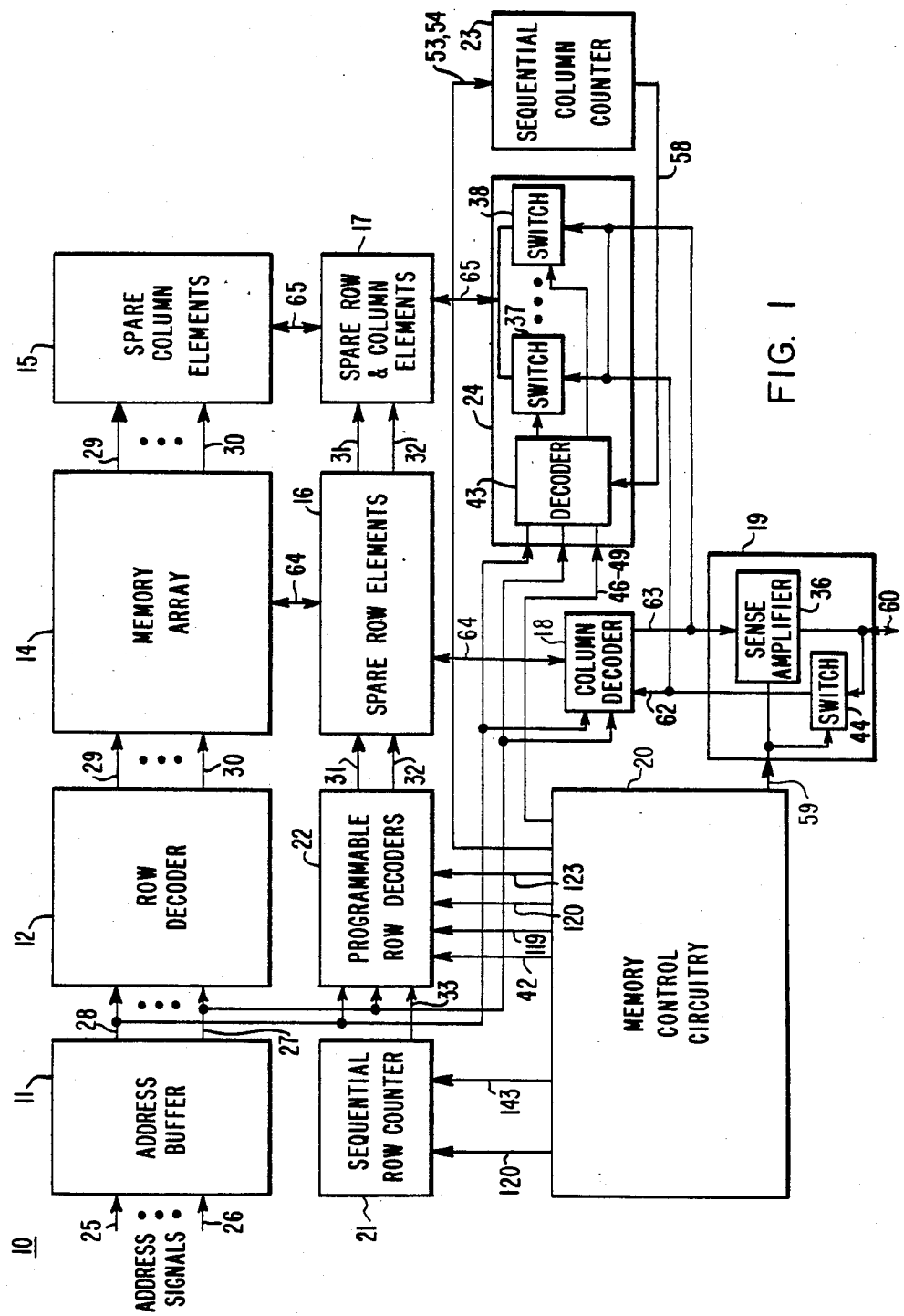
FIG. 1 is a block diagram of the invention.

Referring to the drawings, and in particular, to FIG. 1, a semiconductor memory 10 is shown in block diagram form comprising address buffer 11, row decoder 12, memory array 14, spare column elements 15, spare row elements 16, spare row and column elements 17, column decoder 18, data I/O 19 and memory control circuitry 20. Sequential row counter 21 functions to select for programming one of a plurality of programmable row decoders 22. Sequential column counter 23 functions to select for programming one of a plurality of programmable column decoders 24 to respond to a specific address.

A plurality of address signals are routed over lines 25 and 26 and may include 16 address lines for decoding a 64 K random access memory (RAM) or 64 K read only memory (ROM). Address buffer 11 functions to buffer the address signals and provide true and complement signals over output lines 27 and 28. Lines 27 and 28 are coupled to an input of row decoder 12 which functions to decode or select one of a plurality of rows of memory bits in memory array 14. Lines 29 and 30 represent two output lines from row decoder 12 to memory array 14. Address lines 27 and 28 are also coupled to programmable row decoders 22 and programmable column decoders 24. Programmable row decoders 22 are coupled to spare row elements 16 over lines 31 and 32. Lines 31 and 32 are also coupled to spare row and column elements 17. Sequential row counter 21 is coupled over line 33 to programmable row decoders 22 and functions to select a spare row decoder for programming. Memory control circuitry 20 provides control signals to sequential row counter 21 over lines 120 and 143. Memory control circuitry 20 provides control signals to programmable row decoders 22 over lines 42, 119, 120 and 123. Memory control circuitry 20 provides control signals to programmable column decoders 24 over lines 46 through 49. Memory control circuitry 20 provides control signals to sequential column counter over lines 53 and 54. Sequential column counter 23 is coupled to programmable column decoders 24 over line 58. Memory control circuitry 20 provides control signals to data I/O 19 over line 59. Input data and output data is coupled to data I/O 19 over line 60. Data I/O 19 is coupled to column decoder 18 and programmable column decoders 24 over lines 62 and 63. Lines 27 and 28 carrying the true and complement of the address signals are coupled to an input of column decoder 18 which functions to decode or select one of a plurality of columns of memory cells in spare column elements 15 and spare row and column elements 17. For illustration in FIG. 1 spare column elements 15, spare row and column elements 17 and spare row elements are shown separate from memory 14 but may actually be included in memory 14 with the spare rows and columns appropriately interconnected. Column decoder 18 is coupled over line 64 to spare row elements 16 and memory array 14. Programmable column decoder 24 is coupled to spare row and column elements 17 and spare column elements 15 over line 65.

Programmable column decoders 24 may for example include decoder 43 having a plurality of outputs coupled to a plurality of respective switches 37 and 38 which will couple one column at a time of spare column elements 15 and 17 to data I/O 19. Data I/O 19 may include a sense amplifier 36 for sensing signals during a read operation on lines 63 to provide an output on line 60. Switch 44 responds to a control signal on line 59 to couple line 60 to line 62 at the times a data signal is on line 60 and is to be written during a write operation into memory array 14, spare row elements 16, spare column elements 15 and spare row and column elements 17.

One example of semiconductor memory circuitry is found in U.S. Pat. No. 4,124,900 which issued on Nov. 7, 1978 to P. C. Smith, one of the inventors herein, and J. L. Fagan and assigned to the assignee, herein, wherein a portion of the decoder transistors 171 through 190 of FIG. 2A and 2B may be replaced with the invention herein, namely programmable column decoders 24. U.S. Pat. No. 4,124,900 is herein incorporated by reference to show one example of circuitry suitable for a semiconductor memory.

A second example of semiconductor memory circuitry is found in U.S. Pat. No. 4,090,258 which issued on May 16, 1978 to J. R. Cricchi and assigned to the assignee herein, wherein the output of a programmable column decoder of the invention herein may be coupled to Y1, line 122, of FIG. 3A. A second programmable column decoder of the invention herein may be coupled to Y8, line 322, of FIG. 3A. U.S. Pat. No. 4,090,258 is herein incorporated by reference to show a second example of circuitry suitable for a semiconductor memory.

In a read or write operation of the embodiment of FIG. 1, address signals over lines 25 and 26 select a row and column in memory array 14. When semiconductor memory 10 is tested at the wafer stage or after being packaged, particular bits in memory array 14 or particular decoders in row decoder 12 or in column decoder 18 may be faulty rendering semiconductor memory 10 useless unless spare row decoders and spare memory elements or spare column decoders may be substituted in place of the faulty bits. The faulty row or column is disabled and the programmable row decoders 22 or programmable column decoders 24 are programmed to respond to the address of the faulty row or column. Sequential row counter 21 and sequential column counter 23 are indexed internally each time a row decoder or column decoder is used in decoders 22 or 24 to provide control signals to the next available row decoder or column decoder when substitution is desired. The status of sequential row counter 21 and sequential column counter 23 is stored in a variable threshold transistors so that the information is not lost when power is removed from semiconductor memory 10.

Figure 2:
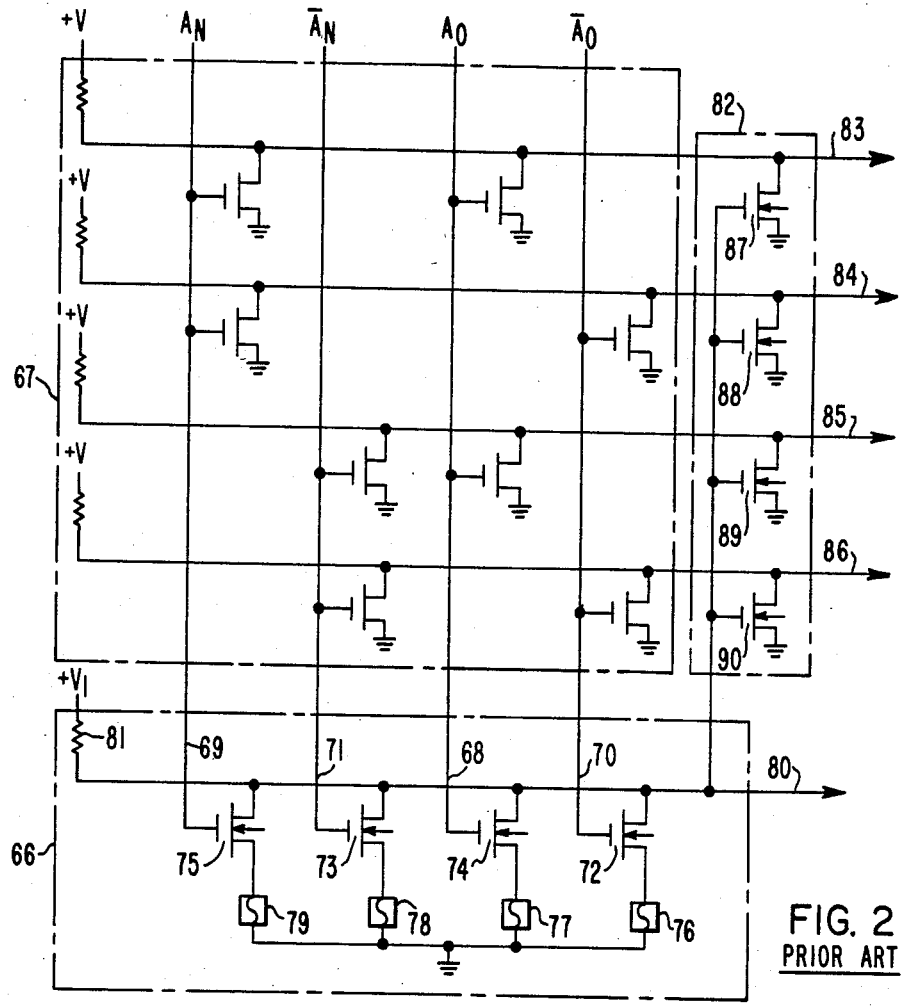
FIG. 2 is a circuit schematic of a programmable decoder of the prior art.

FIG. 2 is a circuit schematic of a programmable decoder 66 of the prior art. A typical nonprogrammable decoder 67 is also shown. The programmable decoder 66 has address signals $A_O$ and $A_N$ coupled over lines 68 and 69 respectively. Address signals $\overline{A_O}$ and $\overline{A_N}$ are coupled over lines 70 and 71 respectively to the gate of transistors 72 and 73. Lines 68 and 69 are coupled to the gates of transistors 74 and 75. The sources of transistors 72 through 75 are each coupled through fuses 76 through 79, respectively, to ground potential. The drain of transistors 72 through 75 are coupled together over line 80 to form the output of decoder 66 and through resistor 81 to a voltage $V_1$. Fuses 76 through 79 may, for example, be nichrome metal or a semiconductor such as polysilicon material which may be opened or blown by passing a current of 100 milliamps for 1 millisecond through the fuse which causes the fuse to thermally heat up and blow the material away, leaving an open circuit. During programming of decoder 66 the complement of the address signals desired for the decoder to respond to is placed on the address lines causing two of the four transistors 72 through 75 to conduct, which will permit current to pass through the fuse, by way of line 80 and blow the respective fuses. The decoder after blowing selected fuses will act as an NAND gate responsive to the addresses which are low through transistors associated with fuses which are not blown permitting line 80 to go high. After the selected fuses are blown in decoder 66 the decoder responds in the same fashion as decoder 67. A disable circuit 82 functions to clamp the outputs of row decoder 67 to ground potential at times row decoder 66 responds to an address wherein output line 80 goes high. The outputs of row decoder 67, lines 83 through 86, are each coupled to the drain of transistors 87 through 90, respectively. The source of transistors 87 through 90 are coupled to ground potential. The gate of transistors 87 through 90 are each coupled to line 80.

Figure 3:
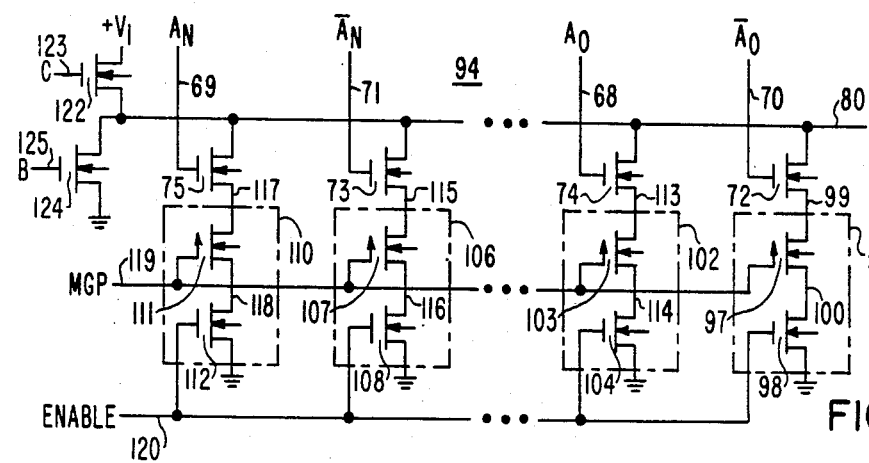
FIG. 3 is a schematic circuit of one embodiment of the invention, a programmable row or column decoder suitable for use in FIG. 1.

FIG. 3 is a schematic circuit of one embodiment of a programmable decoder usable in FIG. 1. In FIG. 3 like references are used for functions corresponding to the apparatus of FIG. 2. In FIG. 3, program element 96 replaces fuse 76 in FIG. 2. Program element 96 may be programmed to be conducting or nonconducting by the application of certain control voltages and the value of the address signal on line 70. Program element 96 comprises transistor 97 and 98 wherein transistor 97 is a variable threshold transistor and transistor 98 is a fixed threshold transistor. The drain of transistor 97 is coupled to the source of transistor 72. The source of transistor 97 is coupled to the drain of transistor 98. The source of transistor 98 is coupled to ground potential. Programming element 102 includes transistors 103 and 104. Programming element 106 includes transistors 107 and 108. Programming element 110 includes transistors 111 and 112. Transistors 103, 107 and 111 are variable threshold transistors, and transistors 104, 108 and 112 are fixed threshold transistors. The drain of transistor 103 is coupled over line 113 to the source of transistor 74. The source of transistor 103 is coupled to the drain of transistor 104 over line 114. The drain of transistor 107 is coupled to the source of transistor 73 over line 115. The source of transistor 107 is coupled to the drain of transistor 108 over line 116. The drain of transistor 111 is coupled to the source of transistor 75 over line 117. The drain of transistor 112 is coupled to the sources of transistor 111 over line 118. The sources of transistors 104, 108 and 112 are coupled to ground potential. The gates of transistors 97, 103, 107 and 111 are coupled over line 119 to control signal MGP. The gates of transistors 98, 104, 108 and 112 are coupled over line 120 to control signal ENABLE. Output line 80 is coupled to a potential $V_1$ through transistor 122. The gate of transistor 122 is coupled over line 123 to control signal C. Output line 80 is also coupled to ground potential through transistor 124. The gate of transistor 124 is coupled over line 125 to control signal B. Transistors 72 through 75, 98, 104, 108, 112, 122 and 124 may be N channel enhancement mode field effect transistors of fixed threshold voltage. Transistors 97, 103, 107 and 111 may be N channel field effect transistors having a variable threshold to permit the transistors to be switched from the depletion mode to the enhancement mode and vice versa.

Figure 4:
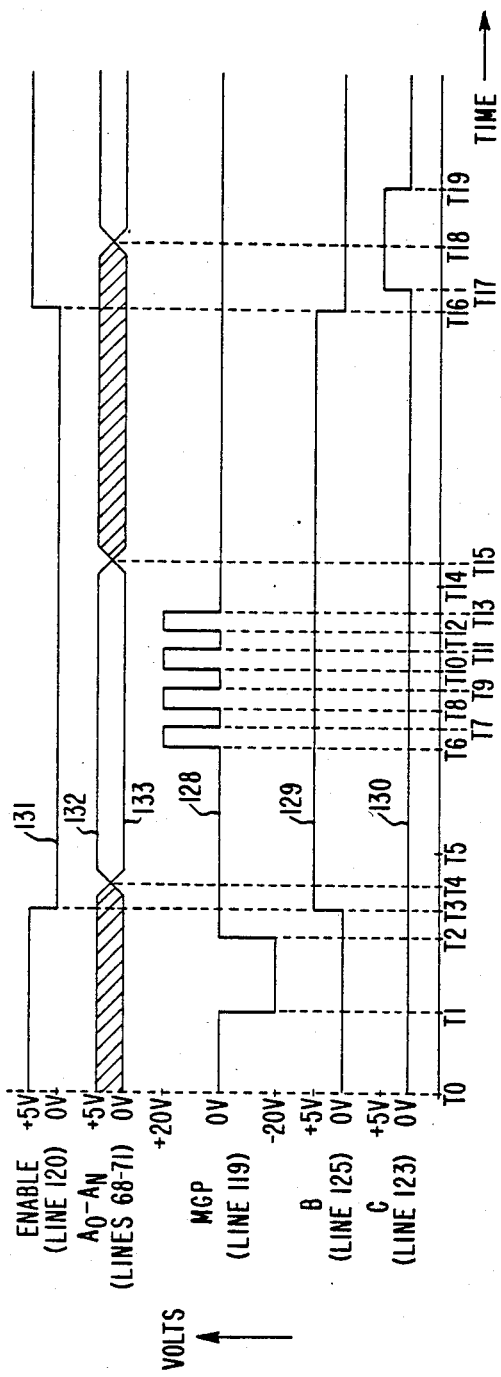
FIG. 4 shows typical waveforms for operation of the embodiment in FIG. 3.

Referring to FIG. 4, typical waveforms are shown for the operation of the embodiment in FIG. 3. In FIG. 4 the ordinate represents voltage and the absicissa represents time. Prior to writing a specific address into programmable row decoder 94 the variable threshold transistor of each program element is set to the depletion mode wherein the transistor will be conducting at times when the gate to source voltage is zero. Control signal MGP shown by waveform 128 in FIG. 4 is at zero volts at time $T_O$. Control signal B shown by waveform 129 and control signal C shown by waveform 130 are also at zero volts at $T_O$. Control signal ENABLE is shown in FIG. 4 by waveform 131 which is at +5 volts at $T_O$. Address signals $A_O$ through $A_N$ may be at either +5 volts or 0 volts shown by waveforms 132 and 133, respectively. With control signals B and C at ground potential, transistors 122 and 124 shown in FIG. 3 are non-conducting. With control signal ENABLE at +5 volts, transistors 98, 104, 108 and 112 are conducting, causing the source of variable threshold transistors 97, 103, 107 and 111 to be at ground potential or close thereto. As shown in FIG. 3 the body of variable threshold transistors 97, 103, 107 and 111 are also at ground potential.

At time $T_1$ control signal MGP goes from 0 volts to −20 volts bringing the gates of transistors 97, 103, 107 and 111 to −20 volts, causing a gate to source and gate to body voltage of −20 volts. −20 volts is sufficient to attract holes into the gate dielectric of variable threshold transistors 97, 103, 107 and 111. At $T_2$ control signal MGP goes from −20 volts to 0 volts. The time interval between $T_1$ and $T_2$ may for example be 10 milliseconds. At time $T_2$ the trapped charge and is gate dielectric of the variable threshold transistors will cause an N channel to form in the variable threshold transistors causing each variable threshold transistor to be conducting and in the depletion mode.

In order to write a specific address into programmable row decoder 94 the following sequence occurs from $T_3$ through $T_{13}$. At $T_3$ control signal ENABLE goes from +5 volts to 0 volts causing line 120 to be at 0 volts and causing fixed threshold transistors 98, 104, 108 and 112 to be non-conducting. At $T_3$, control signal B goes from 0 volts to +5 volts as shown by waveform 129 in FIG. 4 causing transistor 124 shown in FIG. 3 to be turned on pulling line 80 to ground potential or close thereto. At $T_4$ the specific address desired to be programmed into programmable row decoder 94 is placed on the address lines 68 through 71 representative of bits $A_O$ through $\overline{A_N}$.

At $T_6$ control signal MGP goes from 0 volts to +20 volts pulling line 119 to +20 volts. If address signal $A_O$ is high at +5 volts, then line 68 is at 5 volts and transistor 74 is conducting pulling the drain of transistor 103 to ground potential by way of line 80 and transistor 124. The channel of transistor 103 will also be at ground potential through its drain. The +20 volts on the gate of transistor 103 will be sufficient to drive the holes previously trapped in the dielectric layer between the gate and body back into the body or channel of transistor 103 and thereby causing transistor 103 to be in the enhancement mode with a threshold voltage $V_T$ of about 3 to 4 volts. The dielectric layer of the variable threshold transistor such as 103 may be comprised of an initial layer of silicon dioxide of about 20 angstroms in thickness and a subsequent layer of silicon nitride of about 350 angstroms.

If address signal $A_O$ is at +5 volts then address signal $\overline{A_O}$ will be at 0 volts causing the voltage on line 70 shown in FIG. 3 to be at 0 volts. Transistor 72 will therefore be non-conducting and the drain of transistor 97 will be isolated from line 80 and floating. Actually the drain, source and channel will be at the same potential and floating since transistor 98 also will be non-conducting. The potential from the gate across the dielectric to the channel and from the channel to the body will have total 20 volts or the gate to body voltage. Since the voltage will be divided between the gate dielectric and the channel to body capacitance, transistor 97 will not have the holes trapped in its dielectric driven into the channel and the holes will remain in the dielectric material. Transistor 97 will therefore remain in the depletion mode and be conducting at times when the gate to source voltage is zero. To provide an adequate capacitive division as a function of the capacitance of the dielectric and the channel the gate may be pulsed by several pulses with respect to the body. Waveform 128 shows one pulse at time $T_6$ through $T_7$, $T_8$ through $T_9$, $T_{10}$ through $T_{11}$ and $T_{12}$ through $T_{13}$. The pulse duration either by a single pulse or a plurality of pulses should hold the gate at +20 volts for about 10 milliseconds. At $T_{13}$ control signal MGP is at 0 volts.

At time $T_{15}$ the address signals on lines 68 through 71 may assume any address without interfering with the programmed row decoder 94. AT $T_{16}$ control signal B goes from +5 volts to 0 volts causing transistor 124 to be non-conducting. Programmable row decoder 94 has now been written to a specific address and will respond to this specific address by causing line 80 to go high when the specific address appears on the address lines 68 through 71.

For an example of programmable row decoder 94 responding to a specific address the following waveforms are provided. At $T_{16}$ control signal ENABLE goes from 0 to 5 volts causing transistors 98, 104, 108 and 112 to be conducting. At $T_{17}$ control signal C goes from 0 to +5 volts causing transistor 122 to be conducting pulling line 80 to the potential of $+V_1$. At $T_{18}$ a specific address is placed on address lines 68 through 71 causing the voltage on the gate of transistors 72 through 75 to be at either +5 or 0 volts. If address $A_O$ is high and address $\overline{A_O}$ is low, then transistor 74 will be conducting and transistor 72 will be non-conducting. Since transistor 103 is in the enhancement mode it will be non-conducting since control signal MGP is at 0 volts. Transistor 97 is in the depletion mode and will be conducting. No current will flow through programming element 102 since transistor 103 is non-conducting and no current will flow through programming element 96 since transistor 72 is non-conducting. Since address signals $A_O$ correspond to the specific address previously written at $T_3$ through $T_{13}$ line 80 will remain at voltage $+V_1$ and not be pulled to ground potential through either programming element 96 or 102. If the other address signals to other programming elements likewise correspond to the specific address, then programming elements such as 106 and 110 will not pull line 80 to ground potential. Programmable row decoder 94 will respond to the specific address on address lines 68 through 71 and have an output on line 80 of a voltage of $+V_1$ or close thereto.

If the address on programmable row decoder is not the specific address such as for example when $A_O$ is low and $\overline{A_O}$ is high then transistor 74 will be non-conducting and transistor 72 will be conducting. Programming element 102 will be non-conducting since transistor 103 is in the enhancement mode. Programming element 96 will be conducting since transistor 97 is in the depletion mode and current will flow through transistors 72, 97 and 98 to ground potential pulling line 80 low. Thus if any address bit does not correspond to the specific address programmed into the programmable row decoder 94, current will conduct through one of the programming elements to ground potential pulling the output line 80 to ground. In this way programmable row decoder 94 will respond to a specific address previously written into itself and at all other times provide an output on line 80 which is at ground potential due to a conductive path through a programming element and one of the address bit access transistors such as transistor 72 in the above example.

At $T_{19}$ control signal C goes from +5 volts to 0 volts causing transistor 122 to be non-conducting leaving line 80 to float at voltage $V_1$ or remain at ground potential.

Figure 5:
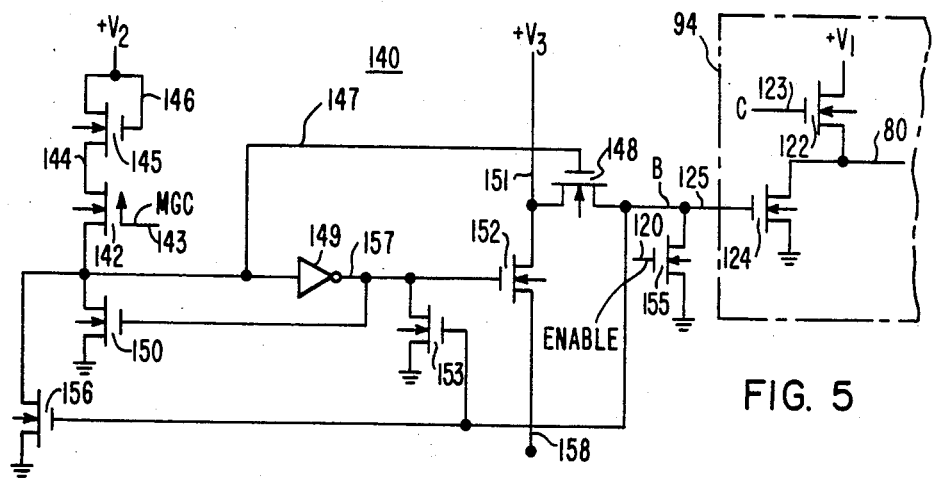
FIG. 5 is a schematic circuit of one embodiment of the invention, a sequence circuit suitable for use for one stage of the sequential row counter or sequential column counter in FIG. 1.

FIG. 5 is a schematic circuit of one embodiment of one stage of sequential row counter 21 in FIG. 1. FIG. 5 shows sequence circuit 140. A portion of programmable row decoder 94 is also shown in FIG. 5 to show the connection of sequence circuit 140 which supplies control signal B to programmable row decoder 94 over line 125. The portion of row decoder 94 that is shown in FIG. 5 includes transistor 122 and transistor 124.

Sequence circuit 140 has a variable threshold transistor 142 which may be a metal nitride oxide semiconductor (MNOS) transistor. The gate of variable threshold transistor 142 is coupled over line 143 to control signal MGC. The drain of variable threshold transistor 142 is coupled over line 144 to the source of transistor 145 which may be a fixed threshold transistor. The gate and drain of transistor 145 is coupled over line 146 to a voltage source $V_2$. Transistor 145 functions to provide a source of current from voltage source $V_2$ which may be at 5 volts to pull up line 144. Transistors 142 and 145 may be of the N channel type. The source of transistor 142 is coupled over line 147 to the gate of transistor 148, an input of inverter 149, and the drain of transistors 150 and 156. Initially, transistor 142 is programmed or polarized to the depletion mode and will be conducting allowing voltage source $V_2$ to charge line 147 positive or to a logic one causing transistor 148 to be conducting. A voltage, $V_3$, is coupled over line 151 to the drain of transistor 148 and the drain of transistor 152. The source of transistor 148 is coupled over line 125 to the gate of transistors 124, 153 and 156 and the drain of transistor 155. The source of transistor 155 is coupled to ground potential. Control signal ENABLE is coupled over line 120 to the gate of transistor 155. Transistor 155 functions to clamp line 125 to ground potential at times control signal ENABLE is high. Voltage $V_3$ supplies current through transistor 148 to raise line 125 to a positive voltage or a logic one at times control signal ENABLE is low causing transistor 155 to be non-conducting. After programmable row decoder 94 has been written into transistor 148 will be permanently turned off by line 147 to prevent control signal B on line 25 from going positive again.

The sources of transistors 150, 153 and 156 are coupled to ground potential. The output of inverter 149 is coupled over line 157 to the gate of transistors 150 and 152 and to the drain of transistor 153. The source of transistor 152 is coupled over line 158 which provides a signal indicative that sequence circuit 140 and the associated programmable row decoder 94 has or has not been written into.

Figure 6:
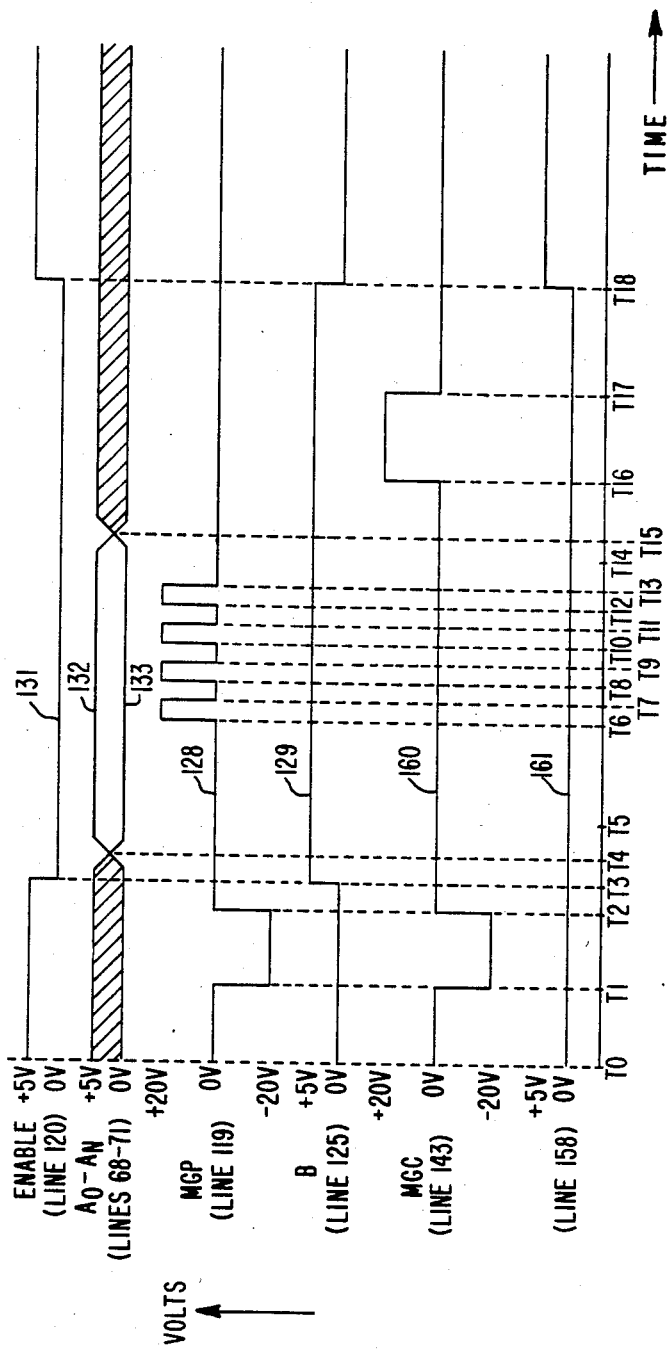
FIG. 6 shows typical waveforms for operation of the embodiment in FIG. 5.

FIG. 6 shows typical waveforms for operation of sequence circuit 140 shown in FIG. 5. In FIG. 6 the ordinate represents voltage and the abscissa represents time. In FIG. 6 $T_O$ through $T_{15}$ corresponds to $T_O$ through $T_{15}$ in FIG. 4 and waveforms 131, 132, 133, 128 and 129 correspond to like numbered waveforms in FIG. 4. With regard to FIG. 6 at time $T_1$ control signal MGC goes from 0 to −20 volts to set transistor 142 in the depletion mode. Transistor 142 needs to be set in depletion mode as an initial condition for the proper operation of sequence circuit 140. Control signal MGC is shown by waveform 160 in FIG. 6. At $T_2$ control signal MGC goes from −20 volts to 0 volts. Transistor 142 is in the conducting state since it has been set in the depletion mode. Current from voltage source $V_2$ will pass through transistors 145 and 142 to charge line 147 positive causing transistor 148 to conduct. Voltage $V_3$ will supply current through transistor 148 to attempt to pull up line 125, control signal B, except that transistor 155 is conducting. At time $T_3$ control signal ENABLE shown in FIG. 6 goes from +5 volts to 0 volts causing transistor 155 to be non-conducting. Line 125 is therefore permitted to be charged to voltage $V_3$ which may for example be 5 volts by current through transistor 148. The condition with control signal B high or +5 volts permits programmable row decoder 94 to be written into, shown in FIG. 3. Control signal B also causes transistor 153 to be conducting which holds line 157 at ground potential. Also at time $T_3$ control signal B causes transistor 156 to be conducting pulling line 147 to ground potential even though transistors 142 and 145 are conducting. Transistor 156 may discharge line 147 slowly so long as line 147 is discharged before control signal ENABLE goes from 0 to +5 volts at $T_{18}$ shown in FIG. 6. With line 147 low or close to ground potential transistor 148 is non-conducting causing line 125 to be floating. Also with line 147 low the output of inverter 149 is pulling high but will be clamped low by the current through transistor 153 which is conducting. At $T_{16}$ control signal MGC goes from 0 to +20 volts causing transistor 142 to be shifted in threshold voltage $V_T$ to the enhancement mode. At time $T_{17}$ control signal MGC goes from +20 volts to 0 volts leaving transistor 142 in the enhancement mode and non-conducting. Line 147 is still held low by transistor 156 which is conducting. At $T_{18}$ control signal ENABLE goes from 0 to +5 volts which causes transistor 155 to be conducting. Control signal B on line 125 is pulled low to ground potential causing transistors 153 and 156 to be non-conducting. With transistor 153 non-conducting, line 157 is no longer clamped to ground potential and the output of inverter 149 pulls line 157 high to +5 volts, for example, causing transistors 152 and 150 to be conducting. Transistor 150 holds line 147 at ground potential. With line 147 held at ground potential transistor 148 is held in the off state or non-conducting. With transistor 152 conducting voltage $V_3$ is permitted to pass through transistor 152 to the output on line 158. Line 158 may now function as a voltage source $V_3$ to another sequence circuit.

If power is turned off from sequence circuit 140, it will recharge to the same logic states as it had before power was removed by action of transistor 142 which will either be conducting or non-conducting depending on whether it is an enhancement or depletion mode. When power is reconnected, control signal ENABLE will be high causing transistor 155 to conduct which will pull line 125 low. Line 147 will start out at ground potential since power had been removed and with power applied to inverter 149, the output of inverter 149 will be high, causing line 157 to be high, causing transistor 150 to conduct which will keep line 147 low. If transistor 142 is still in the depletion mode then line 147 will be pulled high, causing the output of inverter 149 to be pulled low, which will cause transistor 150 to be non-conducting. With line 147 pulled high, transistor 148 will be conducting. Transistor 155 will also be conducting due to control signal ENABLE which will hold line 125 low. Thus with power removed from sequence circuit 140 and reapplied at a later time the logic state of sequence circuit 140 (the voltage on line 147 for example) will resume the same state as it had previously with transistor 148 conducting and transistor 152 non-conducting if transistor 142 is conducting or with transistor 148 non-conducting and transistor 152 conducting at times when transistor 142 is non-conducting.

The voltage on output line 158 is shown by waveform 161 in FIG. 6.

Figure 7A:
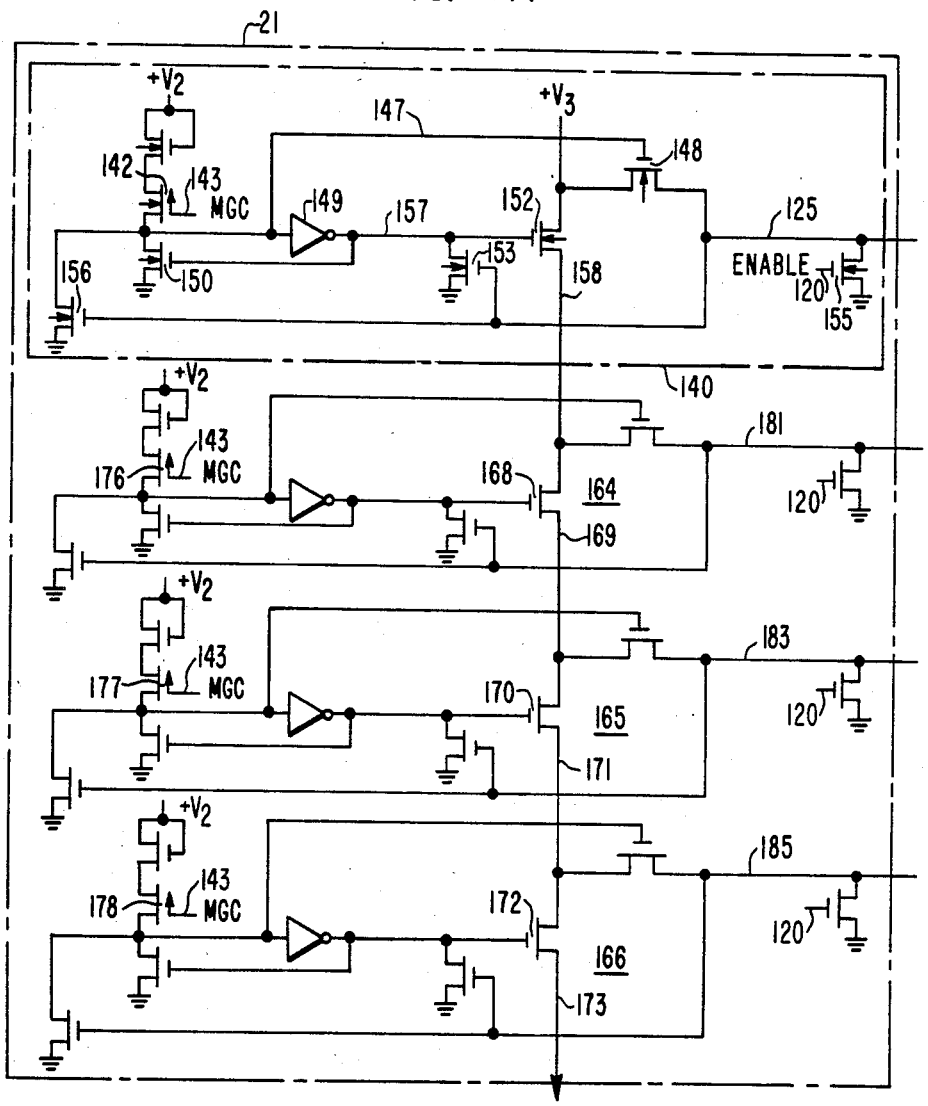
FIGS. 7A and 7B show a schematic circuit of an embodiment of the row decoder, sequential row counter and programmable row decoder of FIG. 1.
Figure 7B:
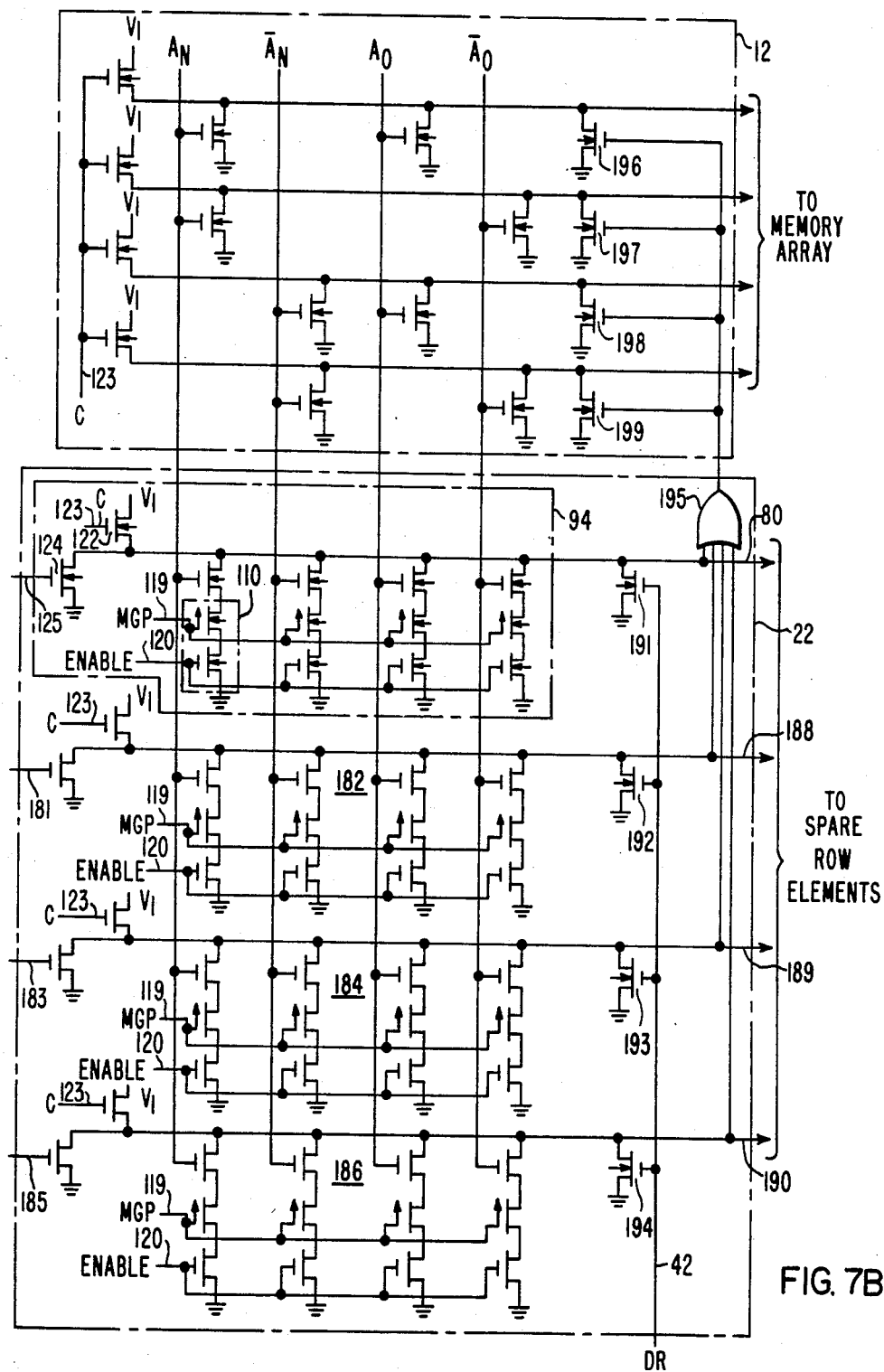

FIGS. 7A and 7B show a schematic circuit of an embodiment of row decoder 12, sequential row counter 21 and programmable row decoder 22 interconnected. Sequential row counter 21 includes sequence circuits 140, 164, 165 and 166. Sequence circuit 140 is also shown in FIG. 5. Line 158 of sequence circuit 140 is coupled to the drain of transistor 168 of sequence circuit 164. The source of transistor 168 is coupled over line 169 to the drain of transistor 170 of sequence circuit 165. The source of transistor 170 is coupled over line 171 to the drain of transistor 172 of sequence circuit 166. The source of transistor 172 is coupled to line 173. Sequence circuit 164 has memory control signal MGC coupled to the gate of variable threshold transistor 176. Sequence circuit 165 has control signal MGC coupled to the gate of variable threshold transistor 177. Sequence circuit 166 has control signal MGC coupled to the gate of variable threshold transistor 178.

In operation after sequence circuit 140 has provided control signal B to programmable row decoder 94, variable threshold transistor 142 is written into the enhancement mode by control signal MGC. The output on line 158 is pulled high by voltage $V_3$ because transistor 152 is switched to the conducting state. The next time control signal ENABLE goes low sequence circuit 164 will be activated by the potential on line 158 to provide a control signal B on line 181. Line 181 going high will activate programmable row decoder 182 for writing in an address. Following writing into programmable row decoder 182, control signal MGC will switch variable threshold transistor 176 from the depletion mode to the enhancement mode since its source will be at ground potential. With transistor 176 in the enhancement mode transistor 168 will be conducting enabling voltage $V_3$ to pass through to line 169. The next time control signal ENABLE goes low line 183 will go high causing programmable row decoder 184 to have an address written into it. After programmable row decoder 184 is written into, control signal MGC will switch transistor 177 from the depletion mode to the enhancement mode since its source will be at ground potential. The output of the inverter will cause transistor 170 to be conducting. Voltage $V_3$ will then pass through transistors 152, 168 and 170 to line 171. The next time control signal ENABLE goes low line 185 will go high enabling an address to be written into programmable row decoder 186. After programmable row decoder 186 is written into, control signal MGC will switch transistor 178 from the depletion to the enhancement mode, causing transistor 172 to be conducting. With transistor 172 conducting voltage $V_3$ will pass through transistors 152, 168, 170 and 172 to line 173 indicating that the four previous sequence circuits have enabled four programmable row decoders to be written into.

The MNOS transistors 176, 177 and 178 in sequence circuits 164, 165 and 166 will not be switched to the enhancement mode unless its source is at ground potential. Then the full voltage of MGC or +20 volts will be across the gate dielectric.

Initially until the sequence circuit is used, the source of the non-volatile transistor will be at or near $V_2$ which may be +5 volts. When MGC is applied to the gate the voltage will divide between the gate to channel and channel to body. The voltage across the gate dielectric will not be sufficient to switch the transistor to the enhancement mode.

The typical threshold voltage of fixed threshold N channel transistors may be 0.5–0.7 volts or may be at 1.3 volts.

The output line of programmable row decoders 182, 184 and 186 are coupled over lines 188, 189 and 190, respectively. The output lines of programmable row decoders 94, 182, 184 and 186 are each coupled to the drain of a transistor, transistors 191, 192, 193 and 194, respectively, and to an input of NOR gate 195. The output of NOR gate 195 is coupled to the gate of transistors 196 through 199. The source of transistors 196 through 199 are coupled to ground potential. The drain of transistors 196 through 199 are each coupled to a respective output of row decoder 12. When control signal DR goes high, transistors 191 through 194 are conducting, clamping the output of programmable row decoders 94, 182, 184 and 186 to ground potential. With the output of the programmable row decoders at ground potential the output of NOR gate 195 is low, causing transistors 196 through 199 to be non-conducting, allowing row decoder 12 to respond to an address. In this mode with the control signal DR high the programmable row decoders are removed or deactivated and row decoder 12 is responsive to all addresses. Therefore, by use of control signal DR memory array 14 may be fully tested since row decoder 12 is reactivated. When control signal DR goes low, then the output of a programmable row decoder may go high at times the programmable row decoder is selected by a specific address. When the output of a programmable row decoder goes high, such as row decoder 94, the output of NOR gate 195 will be high, causing transistors 196 through 199 to be conducting and thereby clamping the outputs of row decoder 12. Thus, row decoder 12 is deactivated at times when one of the programmable row decoders has an output that is high.

A method and circuitry has been described for substituting row decoders and spare memory elements in place of a faulty row decoder or faulty memory element as a function of its address. The address of the faulty memory elements or row decoder is applied to a programmable row decoder which contains non-volatile memory elements which may be set into the enhancement mode from the depletion mode to enable the row decoder to respond to the applied address and provide an output which may be applied to spare memory elements.

Additional circuitry is provided to permit deactivation of the programmable row decoder to permit retest of the original row decoder and memory array. This additional circuitry includes a transistor coupled to the output of each programmable row decoder for clamping the output of each programmable row decoder to ground potential in response to a control signal.

Additional circuitry is provided so at times when a programmable row decoder is activated the original row decoders are deactivated. The output of each row decoder of the original row decoder is coupled through a transistor to ground. An output of a NOR gate is coupled to the gate of each transistor. The NOR gate senses when one of the programmable row decoders is activated. The output signal of the NOR gate will cause the transistors coupled to the output of the row decoders of the original row decoder to be conducting, therefore clamping the output of the decoders of the original row decoder.

A sequence circuit is described which may be coupled together in series and between itself and a respective programmable row decoder to provide a sequential row counter. The sequential row counter will activate a control signal for programming a programmable row decoder one time. After one programmable row decoder is programmed the sequential row counter will provide a control signal to the next programmable row decoder to permit programming of it. When all of the programmable row decoders have been programmed, the sequence row counter will provide an output signal indicative thereof.

Each sequence circuit in a sequential row counter may include a variable threshold transistor which may be written from the depletion mode to the enhancement mode in response to a control signal. The current passing through the variable threshold transistor determines the status of the sequence circuit as to whether its associated programmable row decoder has or has not been programmed. The variable threshold transistor is nonvolatile with loss of power and upon resumption of power the sequence circuit resumes the same output signal to indicate the same status.

We claim:

1. A programmable decoder which may be reprogrammed a plurality of times comprising:
   a plurality of input terminals connected to receive the true and complement of each signal,
   each input terminal coupled to the gate of a fixed threshold first transistor,
   the source of said fixed threshold first transistor coupled to the drain of a variable threshold second transistor,
   the source of said variable threshold second transistor coupled to the drain of a fixed threshold third transistor,
   the source of said fixed threshold third transistor coupled to ground potential,
   the gate of said variable threshold second transistor coupled to a first control signal,
   the gate of said fixed threshold third transistor coupled to a second control signal,
   the drain of each of said fixed threshold first transistor of each of said input terminals coupled in common to an output terminal, wherein said output terminal is connected by a fourth transistor to a first voltage potential and is further connected by a fifth transistor to ground potential.

2. The programmable decoder of claim 1 wherein said fixed threshold first transistors and said fixed threshold third transistors are N channel transistors.

3. The programmable decoder of claim 2 wherein said first and third N channel transistors are in the enhancement mode.

4. The programmable decoder of claim 1 wherein said variable threshold second transistor is an N channel transistor.

5. The programmable decoder of claim 4 wherein said variable threshold second transistor may be switched from the depletion mode to the enhancement mode.

6. The programmable decoder of claim 1 wherein said fourth transistor having a gate, source, and drain.

7. The programmable decoder of claim 7 wherein the source of said fourth transistor is coupled to said output terminal, the drain of said fourth transistor is coupled to said first voltage potential and the gate of said fourth transistor is coupled to a third control signal.

8. The programmable decoder of claim 1 wherein said fifth transistor has a gate, source, and drain.

9. The programmable decoder of claim 8 wherein the drain of said fifth transistor is coupled to said output terminal, the source of said fifth transistor is coupled to ground potential, and the gate of said fifth transistor is coupled to a fourth control signal.

10. A programmable decoder for generating an outut signal in response to an address signal comprising:
    a first fixed threshold transistor,
    a second variable threshold transistor,
    a third fixed threshold transistor,
    said first fixed threshold, said second variable threshold and said third fixed threshold transistors each having a gate, source and drain,
    said drain of said first fixed threshold transistor coupled to a load and to an output terminal,
    said source of said first fixed threshold transistor coupled to the drain of said second variable threshold transistor,
    said source of said second variable threshold transistor coupled to the drain of said third fixed threshold transistor,
    said source of said third fixed threshold transistor coupled to a voltage potential,
    said gate of said first fixed threshold transistor connected to said address signal,
    said gate of said second variable threshold transistor coupled to a first control signal,
    said gate of said third fixed threshold transistor coupled to a second control signal.

11. A sequence circuit for providing control signals comprising:
    a first fixed threshold and second variable threshold transistor having their drains coupled together and connected to a first voltage supply,
    the source of said first fixed threshold transistor coupled to the drain of a third fixed threshold transistor, to a first output and to the gate of a fourth and fifth transistor,
    the gate of said third fixed threshold transistor coupled to a first control signal,
    the drain of said fourth transistor coupled to the source of a variable threshold transistor, the gate of said first fixed threshold transistor, the input of an inverter and the drain of a sixth transistor,
    the output of said inverter coupled to the gate of said second variable threshold transistor, the drain of said fifth transistor and the gate of said sixth transistor,
    the source of said third, fourth, fifth and sixth transistors coupled to ground potential,
    the source of said second variable threshold transistor coupled to a second output,
    the gate of said second variable threshold transistor coupled to a second control signal,
    the drain of said second variable threshold transistor coupled through a current limiting impedance to a second voltage supply.

* * * * *